(12) United States Patent
Chang et al.

(10) Patent No.: US 8,361,635 B2
(45) Date of Patent: Jan. 29, 2013

(54) COATED ARTICLE

(75) Inventors: Hsin-Pei Chang, New Taipei (TW);
Wen-Rong Chen, New Taipei (TW);
Huann-Wu Chiang, New Taipei (TW);
Cheng-Shi Chen, New Taipei (TW);
Cong Li, Shenzhen (CN)

(73) Assignees: Hong Fu Jin Precision Industry (ShenZhen) Co., Ltd., Shenzhen (CN);
Hon Hai Precision Industry Co., Ltd., New Taipei (TW)

( * ) Notice: Subject to any disclaimer, the term of this patent is extended or adjusted under 35 U.S.C. 154(b) by 0 days.

(21) Appl. No.: 13/189,986

(22) Filed: Jul. 25, 2011

(65) Prior Publication Data
US 2012/0094095 A1    Apr. 19, 2012

(30) Foreign Application Priority Data
Oct. 19, 2010    (CN) .......................... 2010 1 0511536

(51) Int. Cl.
*B32B 15/01* (2006.01)
*B32B 15/04* (2006.01)
*B32B 15/20* (2006.01)
*B32B 18/00* (2006.01)

(52) U.S. Cl. ........ 428/627; 428/613; 428/666; 428/658; 428/674; 428/635; 428/215; 428/336

(58) Field of Classification Search .................. 428/613, 428/627, 628, 666, 658, 674, 675, 635, 213, 428/215, 216, 220, 332, 336
See application file for complete search history.

(56) References Cited

U.S. PATENT DOCUMENTS
6,399,219 B1 * 6/2002 Welty et al. .................. 428/626
* cited by examiner

*Primary Examiner* — Michael La Villa
(74) *Attorney, Agent, or Firm* — Altis Law Group, Inc.

(57) ABSTRACT

A coated article is described. The coated article includes a substrate, a combining layer formed on the substrate, a plurality of chromium nitride layers and a plurality of copper-zinc alloy layers formed on the combining layer. The combining layer is a chromium layer. Each chromium nitride layer interleaves with one copper-zinc alloy layer. A method for making the coated article is also described.

10 Claims, 2 Drawing Sheets ns have the same assignee. The disclosure of each of the applications is incorporated by reference into the other applications.

COATED ARTICLE

CROSS-REFERENCE TO RELATED APPLICATIONS

This application is related to the U.S. patent applications listed below. The current application and the related applications have the same assignee. The disclosure of each of the applications is incorporated by reference into the other applications.

| U.S. patent application Ser. No. | Current status | Title | Inventors |
|---|---|---|---|
| 13/189,993 | pending | COATED ARTICLE AND METHOD FOR MAKING THE SAME | HSIN-PEI CHANG et al. |
| 13/189,996 | pending | COATED ARTICLE AND METHOD FOR MAKING THE SAME | HSIN-PEI CHANG et al. |
| 13/190,000 | pending | COATED ARTICLE AND METHOD FOR MAKING THE SAME | HSIN-PEI CHANG et al. |

BACKGROUND

1. Technical Field

The present disclosure relates to coated articles, particularly to a coated article having an antibacterial effect and a method for making the coated article.

2. Description of Related Art

To make the living environment more hygienic and healthy, a variety of antibacterial products have been produced by coating antibacterial metal films on the substrate of the products. The metal may be copper (Cu), zinc (Zn), or silver (Ag). However, the coated metal films are soft and poorly bond to the substrate, so the metal films are prone to abrasion. Moreover, the metal ions within the metal films rapidly dissolve from killing bacterium, so the metal films always have a short useful lifespan.

Therefore, there is room for improvement within the art.

BRIEF DESCRIPTION OF THE FIGURES

Many aspects of the disclosure can be better understood with reference to the following figures. The components in the figures are not necessarily drawn to scale, the emphasis instead being placed upon clearly illustrating the principles of the disclosure. Moreover, in the drawings like reference numerals designate corresponding parts throughout the several views.

DETAILED DESCRIPTION

Figure 1:
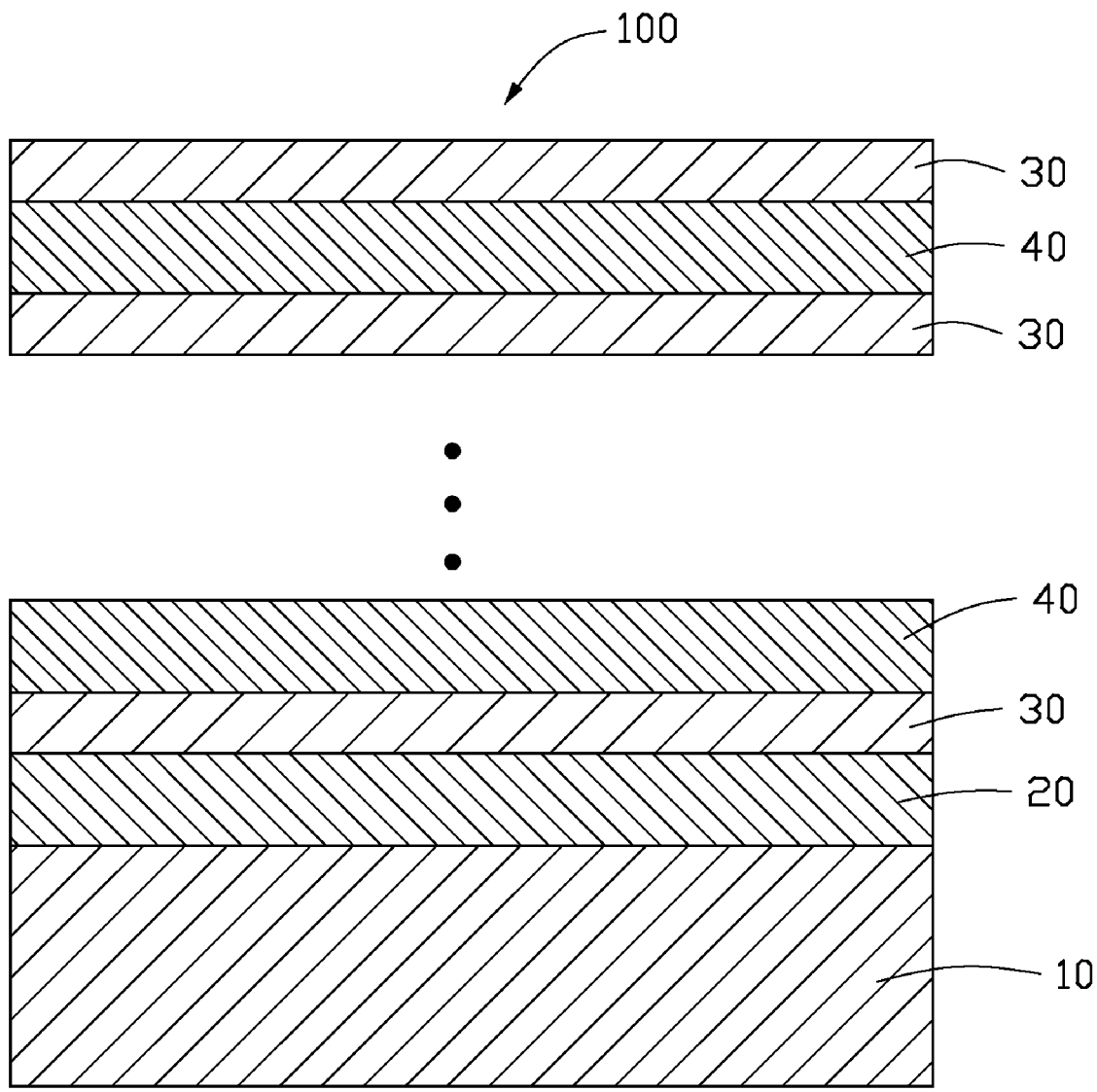
FIG. 1 is a cross-sectional view of an exemplary embodiment of a coated article.

FIG. 1 shows a coated article 100 according to an exemplary embodiment. The coated article 100 includes a substrate 10, a combining layer 20 formed on the substrate 10, a plurality of chromium nitride (CrN) layers 30 and a plurality of copper-zinc (Cu—Zn) alloy layers 40 formed on the combining layer 20. Each CrN layer 30 alternates/interleaves with one Cu—Zn alloy layer 40. One of the CrN layers 30 is directly formed on the combining layer 20. Furthermore, one of the CrN layers 30 also forms the outermost layer of the coated article 100. Therefore, there is typically one more CrN layer 30 than there are Cu—Zn alloy layers 40. The total thickness of the CrN layers 30 and the Cu—Zn alloy layers 40 may be of about 1 µm-8 µm. The total number of the CrN layers 30 may be about 5 layers to about 21 layers. The total number of the Cu—Zn alloy layers 40 may be about 4 layers to about 20 layers. As mentioned above, due to one of the CrN layers 30 also forming the outermost layer of the coated article 100, there is typically one more CrN layer 30 than there are Cu—Zn alloy layers 40.

The substrate 10 may be made of stainless steel or chromium (Cr) contained alloys.

The combining layer 20 may be a chromium (Cr) layer formed on the substrate 10 by vacuum sputtering. The combining layer 20 has a thickness of about 100 nm-200 nm.

The CrN layers 30 may be formed by vacuum sputtering. Each CrN layer 30 may have a thickness of about 50 nm-100 nm. The CrN layers 30 have a porous structure, in which a plurality of tiny holes (not shown) are formed. Additionally, the CrN layers 30 are abrasion and corrosion resistant, which provides the coated article 100 good abrasion and corrosion resistance properties. Moreover, the outermost CrN layer 30 provides the coated article 100 colorful appearance.

The Cu—Zn alloy layers 40 may be formed by vacuum sputtering. Each Cu—Zn alloy layer 40 may have a thickness of about 200 nm-300 nm. Each Cu—Zn alloy layer 40 has a portion that imbeds in the porous structure (or the tiny holes) of the adjacent two CrN layers 30. As such, the Cu—Zn alloy layers 40 are securely attached to the CrN layers 30 and the copper ions or zinc ions within the Cu—Zn alloy layers 40 will not be dissolved rapidly, thus the Cu—Zn alloy layers 40 have persisting antibacterial effect. Furthermore, the outermost CrN layer 30 will protect the Cu—Zn alloy layers 40 from abrasion, which further prolongs the antibacterial effect of the coated article 100.

A method for making the coated article 100 may include the following steps:

The substrate 10 is pre-treated, such pre-treating process may include the following steps:

The substrate 10 is cleaned in an ultrasonic cleaning device (not shown) filled with ethanol or acetone.

Figure 2:
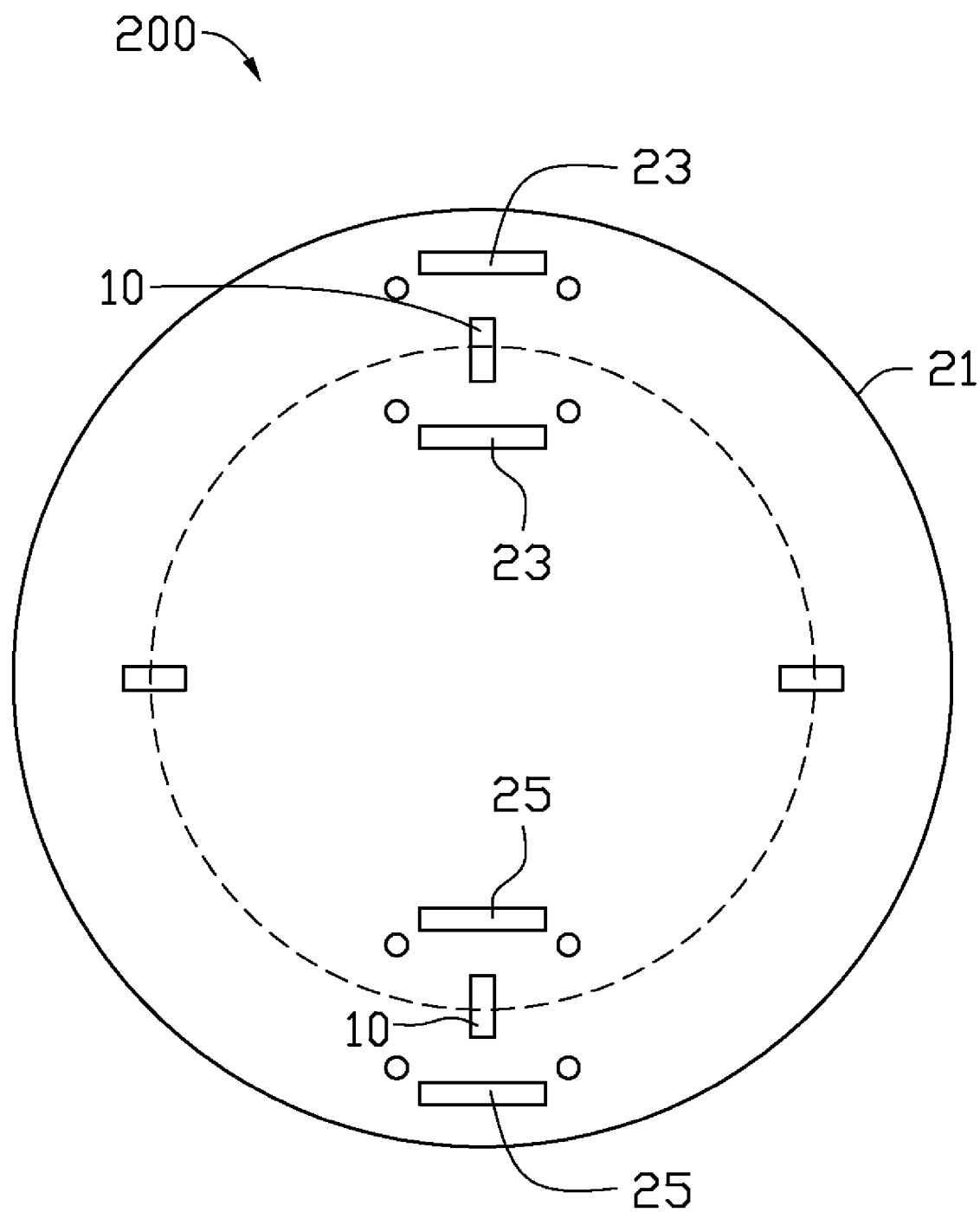
FIG. 2 is an overlook view of an exemplary embodiment of a vacuum sputtering device.

The substrate 10 is plasma cleaned. Referring to FIG. 2, the substrate 10 may be positioned in a coating chamber 21 of a vacuum sputtering device 200. The coating chamber 21 is fixed with chromium targets 23 and Cu—Zn alloy targets 25. The coating chamber 21 is then evacuated to about $4.0 \times 10^{-3}$ Pa. Argon gas (Ar) having a purity of about 99.999% may be used as a working gas and is fed into the coating chamber 21 at a flow rate of about 100 standard-state cubic centimeters per minute (sccm) to 300 sccm. The substrate 10 may have a bias voltage of about −200 V to about −800 V, then high-frequency voltage is produced in the coating chamber 21 and the argon gas is ionized to plasma. The plasma then strikes the surface of the substrate 10 to clean the surface of the substrate 10. Plasma cleaning of the substrate 10 may take about 3 minutes (min)-10 min. The plasma cleaning process enhances the bond between the substrate 10 and the combining layer 20. The chromium targets 23 and the Cu—Zn alloy targets 25 are unaffected by the pre-cleaning process.

The combining layer 20 may be magnetron sputtered on the pretreated substrate 10 by using a direct current power for the chromium targets 23. Magnetron sputtering of the combining layer 20 is implemented in the coating chamber 21.

The inside of the coating chamber 21 is heated to about 80° C.-150° C. Argon gas may be used as a working gas and is fed into the coating chamber 21 at a flow rate of about 100 sccm-300 sccm. The direct current power is applied to the chromium targets 23, and then chromium atoms are sputtered off from the chromium targets 23 to deposit the combining layer 20 on the substrate 10. During the depositing process, the substrate 10 may have a bias voltage of about −50 V to about −150 V. Depositing of the combining layer 20 may take about 5 min-10 min.

One of the CrN layers 30 may be magnetron sputtered on the combining layer 20 by using a direct current power for the chromium targets 23. Magnetron sputtering of the CrN layer 30 is implemented in the coating chamber 21. The substrate 10 in the coating chamber 21 is heated to about 70° C.-130° C. Nitrogen ($N_2$) may be used as a reaction gas and is fed into the coating chamber 21 at a flow rate of about 10 sccm-20 sccm. Argon gas may be used as a working gas and is fed into the coating chamber 21 at a flow rate of about 20 sccm-50 sccm. The direct current power is applied to the chromium targets 23, and then chromium atoms are sputtered off from the chromium targets 23. The chromium atoms and nitrogen atoms are ionized in an electrical field in the coating chamber 21. The ionized chromium then chemically reacts with the ionized nitrogen to deposit the CrN layer 30 on the combining layer 20. During the depositing process, the substrate 10 may have a direct current bias voltage of about −50 V to about −150 V. Depositing of the CrN layer 30 may take about 2 min-3 min.

One of the Cu—Zn alloy layers 40 may be magnetron sputtered on the CrN layer 30 by using a radio frequency power for the Cu—Zn alloy targets 25. The Cu within the Cu—Zn alloy target 25 has a mass percentage of about 80%-90%. Magnetron sputtering of the Cu—Zn alloy layer 40 is implemented in the coating chamber 21. The substrate 10 in the coating chamber 21 is heated to about 70° C.-130° C. Argon gas may be used as a working gas and is fed into the coating chamber 21 at a flow rate of about 20 sccm-50 sccm. The radio frequency power is applied to the Cu—Zn alloy targets 25, and then Cu atoms and Zn atoms are sputtered off from the Cu—Zn alloy targets 25 to deposit the Cu—Zn alloy layer 40 on the CrN layer 30. During the depositing process, the substrate 10 may have a coupled pulse bias voltage of about −180 V to about −350 V. The coupled pulse bias voltage has a pulse frequency of about 10 KHz and a pulse width of about 20 μs. Depositing of the Cu—Zn alloy layer 40 may take about 2 min-3 min.

The steps of magnetron sputtering the CrN layer 30 and the Cu—Zn alloy layer 40 are repeated for about 3-19 times to form the coated article 100. In this embodiment, one more CrN layer 30 may be vacuum sputtered on the Cu—Zn alloy layer 40 and the CrN layer 30 forms the outermost layer of the coated article 100.

It is believed that the exemplary embodiment and its advantages will be understood from the foregoing description, and it will be apparent that various changes may be made thereto without departing from the spirit and scope of the disclosure or sacrificing all of its advantages, the examples hereinbefore described merely being preferred or exemplary embodiment of the disclosure.

What is claimed is:

1. A coated article, comprising:
   a substrate;
   a combining layer formed on the substrate, the combining layer being a chromium layer; and
   a plurality of alternating chromium nitride and copper-zinc alloy layers formed on the combining layer.

2. The coated article as claimed in claim 1, wherein the substrate is made of stainless steel or chromium contained alloys.

3. The coated article as claimed in claim 1, wherein each chromium nitride layer is formed by vacuum sputtering and has a thickness of about 50nm to about 100 nm.

4. The coated article as claimed in claim 1, wherein each copper-zinc alloy layer is formed by vacuum sputtering and has a thickness of about 200 nm to about 300 nm.

5. The coated article as claimed in claim 1, wherein the chromium nitride layers and the copper-zinc alloy layers have a total thickness of about 1 μm to about 8 μm.

6. The coated article as claimed in claim 1, wherein the combining layer is formed by vacuum sputtering and has a thickness of about 100 nm to about 200 nm.

7. The coated article as claimed in claim 1, wherein total number of the chromium nitride layers are 5 layers to 21 layers, and total number of the copper-zinc alloy layers are 4 layers to 20 layers.

8. The coated article as claimed in claim 1, wherein one of the chromium nitride layers is directly formed on the combining layer; one of the chromium nitride layers forms an outermost layer of the coated article.

9. The coated article as claimed in claim 8, wherein the chromium nitride layers have porous structure.

10. The coated article as claimed in claim 9, wherein each copper-zinc alloy layer is sandwiched by each two chromium nitride layers adjacent to the copper-zinc alloy layer, the each copper-zinc alloy layer has a portion that imbeds in the porous structure of the each two adjacent chromium nitride layers.

\* \* \* \* \*